United States Patent [19]

Kikuda et al.

[11] Patent Number: 5,357,478
[45] Date of Patent: Oct. 18, 1994

[54] SEMICONDUCTOR INTEGRATED CIRCUIT DEVICE INCLUDING A PLURALITY OF CELL ARRAY BLOCKS

[75] Inventors: Shigeru Kikuda; Shigeru Mori; Yoshikazu Morooka; Hiroshi Miyamoto; Makoto Suwa; Mitsuya Kinoshita, all of Hyogo, Japan

[73] Assignee: Mitsubishi Denki Kabushiki Kaisha, Tokyo, Japan

[21] Appl. No.: 767,332

[22] Filed: Sep. 30, 1991

[30] Foreign Application Priority Data

Oct. 5, 1990 [JP] Japan .................................. 2-268809

[51] Int. Cl.$^5$ ................................................ G11C 8/00
[52] U.S. Cl. .................................. 365/230.03; 365/51; 365/63
[58] Field of Search .................. 365/230.03, 63, 51

[56] References Cited

U.S. PATENT DOCUMENTS

| | | | |
|---|---|---|---|
| 4,660,174 | 4/1987 | Takemae et al. | |
| 4,837,747 | 6/1989 | Dosaka et al. | 365/230.05 |
| 5,040,152 | 8/1991 | Voss et al. | 365/63 |
| 5,208,782 | 5/1993 | Sakuta et al. | 365/230.03 |
| 5,210,723 | 5/1993 | Bates et al. | 365/230.03 |
| 5,222,047 | 6/1993 | Matsuda et al. | 365/230.03 |

FOREIGN PATENT DOCUMENTS 2152752A 8/1985 United Kingdom .
2184311A 6/1987 United Kingdom .

OTHER PUBLICATIONS

1987 IEEE International Solid-State Circuits Conference, Digest of Technical Papers, Feb. 1987, "A 70ns 4Mb DRAM in a 300mil DIP using 4-Layer Poly", Mochizuki et al.
Abstract of "Nikkei Macro Device", special edition, No. 1, May 1987, pp. 117–130, 63.7MM$^2$ 4M DRAM with Proportionally Reduced Stacked Cells.

Primary Examiner—Eugene R. LaRoche
Assistant Examiner—Christopher R. Glembocki
Attorney, Agent, or Firm—Lowe, Price, LeBlanc & Becker

[57] ABSTRACT

A plurality of sub chips are formed on a chip. An input-/output buffer region is arranged around the plurality of sub chips. Each sub chip includes a sub chip control circuit region and a plurality of memory cell array blocks. Each memory cell array block includes a memory cell array region, a row decoder and control circuit region, a sense amplifier region and an input/output latch region.

8 Claims, 8 Drawing Sheets

SEMICONDUCTOR INTEGRATED CIRCUIT DEVICE INCLUDING A PLURALITY OF CELL ARRAY BLOCKS

BACKGROUND OF THE INVENTION

1. Field of the Invention

The present invention relates generally to semiconductor integrated circuit devices, and more particularly, to semiconductor integrated circuit devices including a plurality of dispersedly arranged cell array blocks.

2. Description of the Related Art

FIG. 7 is a diagram showing a layout on a conventional semiconductor memory chip. An input/output buffer region 7 is formed on the peripheral portion of a semiconductor chip 1 and a chip control circuit region 8 is formed on the central portion of semiconductor chip 1. Four memory cell array blocks 9 are formed on semiconductor chip 1.

Input/output buffer region 7 includes a bonding pad for inputting an externally applied signal and outputting a signal to the outside of the chip, a buffer for input/output signals including an address signal, some of peripheral circuits and signal interconnection therebetween.

A chip control circuit region 8 includes a control circuit for controlling each circuit in chip 1 and an address signal generation circuit such as a predecoder.

Each memory cell array block 9 includes a memory cell array having a capacity one-fourth of the storage capacity of the entire chip, a decoder, a sense amplifier, an input/output latch and some of control circuits for driving these circuits.

FIG. 8 is a functional block diagram showing the detailed arrangement of the semiconductor memory of FIG. 7. Chip 1 includes bonding pads (hereinafter referred to as pads) P1–P7, an input/output buffer circuit 70, a chip control circuit 80 and four memory cell array blocks 90. Pads P1–P7 and input/output buffer circuit 70 are formed in input/output buffer region 7 of FIG. 7. Chip control circuit 80 is formed in chip control circuit region 8 of FIG. 7. Each memory cell array block 90 corresponds to each memory cell array block 9 of FIG. 7.

Input/output buffer circuit 70 includes a data out buffer 801 in the final stage, and a data in buffer 802, address buffers 803 and 804, a row address strobe buffer 805, a column address strobe buffer 806 and a write enable buffer 807 all of which are in the first stage.

Data out buffer 801 outputs data Dout applied from chip control circuit 80 to pad P1. Data in buffer 801 inputs external data Din applied through pad P2 to chip control circuit 80. Address buffers 803 and 804 input external address signals A0–An applied through pads P3 and P4 to chip control circuit 80. Row address buffer 805, column address strobe buffer 806 and write enable buffer 807 input external row address strobe signal $\overline{RAS}$, column address strobe signal $\overline{CAS}$ and write enable signal $\overline{WE}$ applied through pads P5, P6 and P7, respectively, to chip control circuit 80.

Chip control circuit 80 includes a data input/output buffer and selector 808, a block select circuit 809, an address buffer and predecoder 810 and a clock generator 811.

Clock-generator 811 controls data input/output buffer and selector 808, block select circuit 809 and address buffer and predecoder 810 in response to the row address strobe signal $\overline{RAS}$, the column address strobe signal $\overline{CAS}$ and the write enable signal $\overline{WE}$. Address buffer and predecoder 810 predecodes address signals A0–An and applies the predecoded signals to memory cell array blocks 90 and block select circuit 809. Block select circuit 809 selects one of the four memory cell array blocks 90 and activates the same. Data input/output buffer and selector 808 applies data read from the selected memory cell array block 90 to data out buffer 801 in a reading operation. Data input/output buffer and selector 808 also applies data applied from data in buffer 802 to the selected memory cell array block 90 in a writing operation.

Each memory cell array block 90 includes a memory cell array 901, a memory cell array block generator 902, a column decoder 903, a row decoder 904, an input/output latch 905 and a sense amplifier 906.

Memory cell array block clock generator 902 controls each circuit in memory cell array block 90. Column decoder 903 and row decoder 904 designate an address of a memory cell in memory cell array 901 in response to a predecoded signal. In a reading operation, data read from memory cell array 901 is amplified by sense amplifier 906 and applied to data input/output buffer and selector 808 through input/output latch 905. In a writing operation, the data applied from data input/output buffer and selector 808 is written in memory cell array 901 through input/output latch 905.

An operation of the semiconductor memory will be schematically described with reference to FIG. 7. Data, address signals and control signals input through the pads in input/output buffer region 7 are amplified by the input/output buffers in input/output buffer region 7 and transmitted to chip control circuit region 8 arranged at the center of chip 1. In chip control circuit region 8, an address signal selects one of the four memory cell array blocks 9. A writing or reading operation is performed in the selected memory cell array block 9.

In a reading operation, data read from the selected memory cell array block 9 is transmitted to chip control circuit region 8 at the center of chip 1 wherein the data is amplified. The amplified data is transmitted to input/output buffer region 7 and output to the outside of the chip through the output buffer and the pad.

Thus, a control signal or an address signal generated in chip control circuit region 8 arranged at the center of chip 1 drive memory cell array blocks 9 arranged externally to chip control circuit region 8. As a result, a length of the interconnection between chip control circuit region 8 and each memory cell array block 9 is approximately half the longer side of chip 1, causing signal delay due to the interconnection.

In order to prevent such signal delay, the size of a transistor for driving signals is increased, thereby enhancing current drivability.

The number of signals generated in chip control circuit region 8 is several times the number of signals input or output from or to the outside of the chip. Thus, circuits for generating a part of the signals for driving the memory cell array is located in each memory cell array block 9. As a result, the number of signals transmitted from chip control circuit region 8 to each memory cell array block 9 is reduced to decrease the load of the circuits for generating the signals for driving the memory cell array, thereby achieving a high-speed operation and reduction in power consumption.

However, chip control circuit region 8 arranged at the central portion of chip 1 increases a length of a signal interconnection between control circuits (by the amount approximately as long as the shorter side of chip 1).

As described above, the length of the signal interconnection between chip control circuit region 8 and each memory cell array block 9 is increased. In addition, a signal interconnection is increased in such a region including a large number of signal interconnections as chip control circuit region 8. Each load capacitance is also increased to increase signal delay due to the interconnections.

Enhancing current drivability of a signal generation circuit to reduce such delay results in an increase in a chip area and power consumption.

SUMMARY OF THE INVENTION

An object of the present invention is to provide a semiconductor integrated circuit device operable at a high speed and requiring reduced power consumption with reduced signal delay caused by interconnections.

Another object of the present invention is to provide a layout allowing signal delay to be reduced and an operation speed to be increased while reducing power consumption in a semiconductor integrated circuit device including a plurality of cell array blocks.

A further object of the present invention is to reduce signal delay due to interconnections and power consumption without increasing a chip area.

The semiconductor integrated circuit device formed on a chip according to the present invention includes a plurality of sub chips and a first control circuit for controlling the operation of the plurality of sub chips. Each of the plurality of sub chips includes a plurality of cell array blocks and a second control circuit arranged at the center of the plurality of cell array blocks for controlling the operation of the plurality of cell array blocks. Each of the plurality of cell array blocks includes a cell array and a third control circuit for controlling the operation of the cell array.

In the semiconductor integrated circuit device, the chip is divided into the plurality of sub chips each including the second control circuit arranged therein to allow each sub chip to divisionally operate. Furthermore, each sub chip is divided into the plurality of cell array blocks each including the third control circuit arranged therein to allow each cell array block to divisionally operate.

As a result, such a semiconductor integrated circuit device can be obtained as is operable at a high speed and requires reduced power consumption with reduced signal delay due to interconnections without increasing a chip area.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
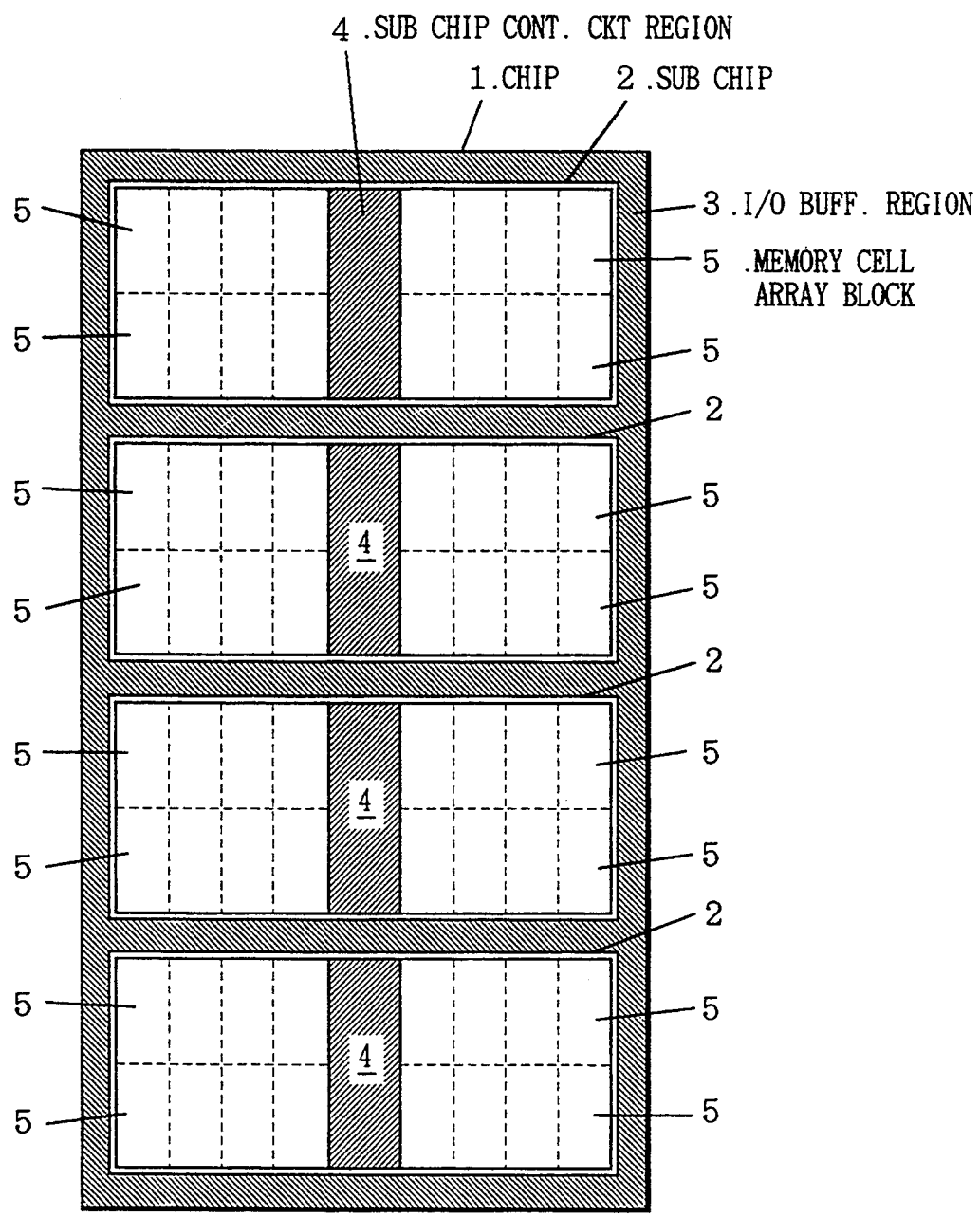
FIG. 1 is a diagram showing a layout on a semiconductor memory chip according to one embodiment of the present invention.

With reference to FIG. 1 showing one embodiment of the present invention, four sub chips 2 are formed on a chip 1 and an input/output buffer region 3 is formed on the peripheral portion of the chip. Input/output buffer region 3 includes a bonding pad for inputting an externally applied signal or outputting a signal to the outside of the chip, a buffer in a first stage for input signals including an address signal, a buffer in a final stage for output signals, some of peripheral circuits and signal interconnections therebetween.

Each sub chip 2 includes a sub chip control circuit region 4 and 16 memory cell array blocks 5. Sub chip control circuit region 4 is disposed at the center of sub chip 2 with eight memory cell array blocks 5 respectively arranged at the opposite sides thereof.

Each sub chip control circuit 4 includes a control circuit for controlling sub chips 2 and such an address signal generation circuit corresponding to each sub chip 2 as a predecoder. Each sub chip 2 has an individual circuit arrangement.

Each memory cell array block 5 includes a memory cell array having a storage capacity 1/64 of the total storage capacity of chip 1, a decoder, a sense amplifier, an input/output latch and some of control circuits for driving these elements.

Figure 2:
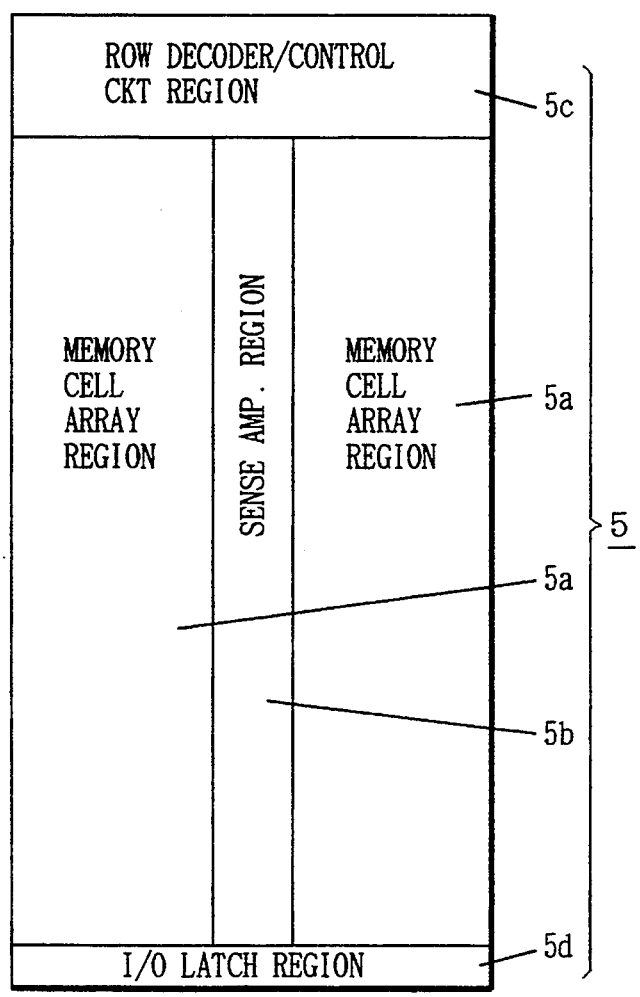
FIG. 2 is a diagram showing an arrangement of a memory cell array block included in the semiconductor memory of FIG. 1.

FIG. 2 shows one example of an arrangement of a memory cell array block 5. Memory cell array block 5 includes two memory cell array regions 5a, a sense amplifier region 5b, a row decoder and control circuit region 5c and an input/output latch region 5d.

Figure 3:
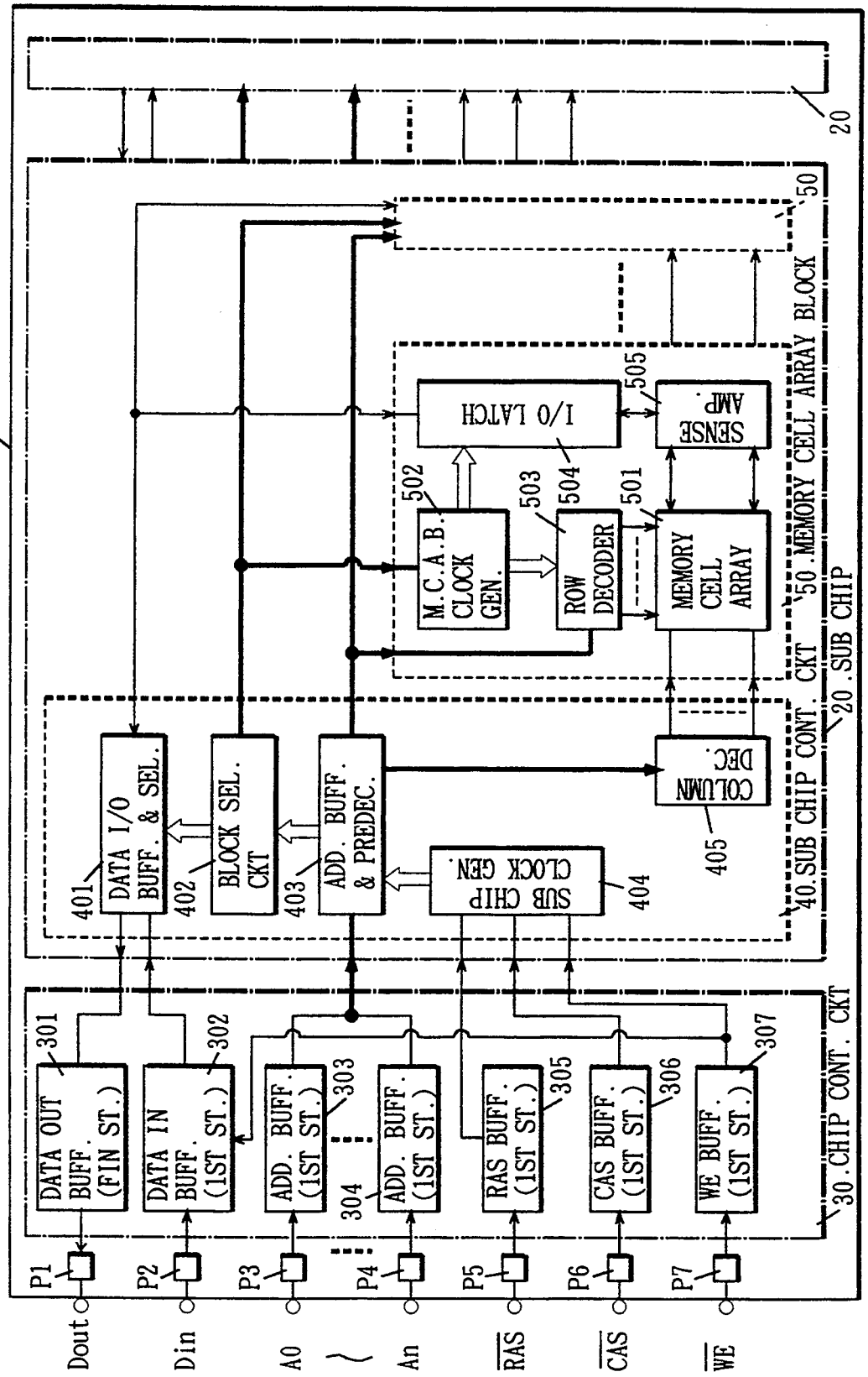
FIG. 3 is a functional block diagram showing one example of the detailed arrangement of the semiconductor memory shown in FIG. 1.

FIG. 3 is a functional block diagram showing one example of a detailed arrangement of the semiconductor memory shown in FIG. 1. Chip 1 includes pads P1–P7, four sub chips 20 and a chip control circuit 30. Pads P1–P7 and chip control circuit 30 are included in input/output buffer region 3 of FIG. 1. Sub chip 20 corresponds to sub chip 2 of FIG. 1.

Each sub chip 20 includes a sub chip control circuit 40 and 16 memory cell array blocks 50. Sub chip control circuit 40 is included in sub chip control circuit region 4 of FIG. 1. Each memory cell array block 50 corresponds to each memory cell array block 5 of FIG. 1.

Chip control circuit 30 includes a data output buffer 301 in a final stage, and a data in buffer 302, address buffers 303 and 304, a row address strobe buffer 305, a column address strobe buffer 306 and a write enable buffer 307, all of which are in a first stage.

Data out buffer 301 outputs data Dour applied from one of the sub chips 20 to pad P1. Data in buffer 302 applies external data Din supplied through pad P2 to the four sub chips 20. Address buffers 303 and 304 apply external address signals A0–A4 supplied through pads P3 and P4 to the four sub chips 20. Row address strobe buffer 305, column address strobe buffer 306 and write enable buffer 307 apply external row address strobe signal $\overline{RAS}$, column address strobe signal $\overline{CAS}$ and write enable signal $\overline{WE}$ respectively supplied through pads P5, P6 and P7 to the four sub chips 20. Write enable signal $\overline{WE}$ is also applied to data in buffer 302.

Sub chip control circuit 40 includes a data input/output buffer and selector 401, a block select circuit 402, an address buffer and predecoder 403, a sub chip clock generator 404 and a column decoder 405.

Sub chip clock generator 404 controls address buffer and predecoder 403, block select circuit 402 and data input/output buffer and selector 401 in response to the row address strobe signal $\overline{RAS}$, the column address strobe signal $\overline{CAS}$ and the write enable signal $\overline{WE}$. Address buffer and predecoder 403 predecodes the address signals A0-An and applies the predecoded signals to column decoder 405 and 16 memory cell array blocks 50. Address buffer and predecoder 403 controls block select circuit 402. Upon the selection of a sub chip 20 by address signals A0-An, block select circuit 402 selects one of 16 memory cell array blocks 50 and activates the same. Data input/output buffer and selector 401 applies the data read from the selected memory cell array block 50 to data output buffer 301 in a reading operation. Data input/output buffer and selector 401 applies the data applied from data in buffer 302 to the selected memory cell array block 50 in a writing operation.

Each memory cell array block 50 includes a memory cell array 501, a memory cell array block clock generator 502, a row decoder 503, an input/output latch 504 and a sense amplifier 505.

Memory cell array block clock generator 502 controls row decoder 503, input/output latch 504 and sense amplifier 505. Row decoder 503 and column decoder 405 in sub chip control circuit 40 designates an address of a memory cell in memory cell array 501 in response to a predecoded signal. The data read from memory cell array 501 is amplified by sense amplifier 505 and applied to data input/output buffer and selector 401 through input/output latch 504 in a reading operation. The data applied from data input/output buffer and selector 401 is written in memory cell array 501 through input/output latch 504 in a writing operation.

Figure 4:
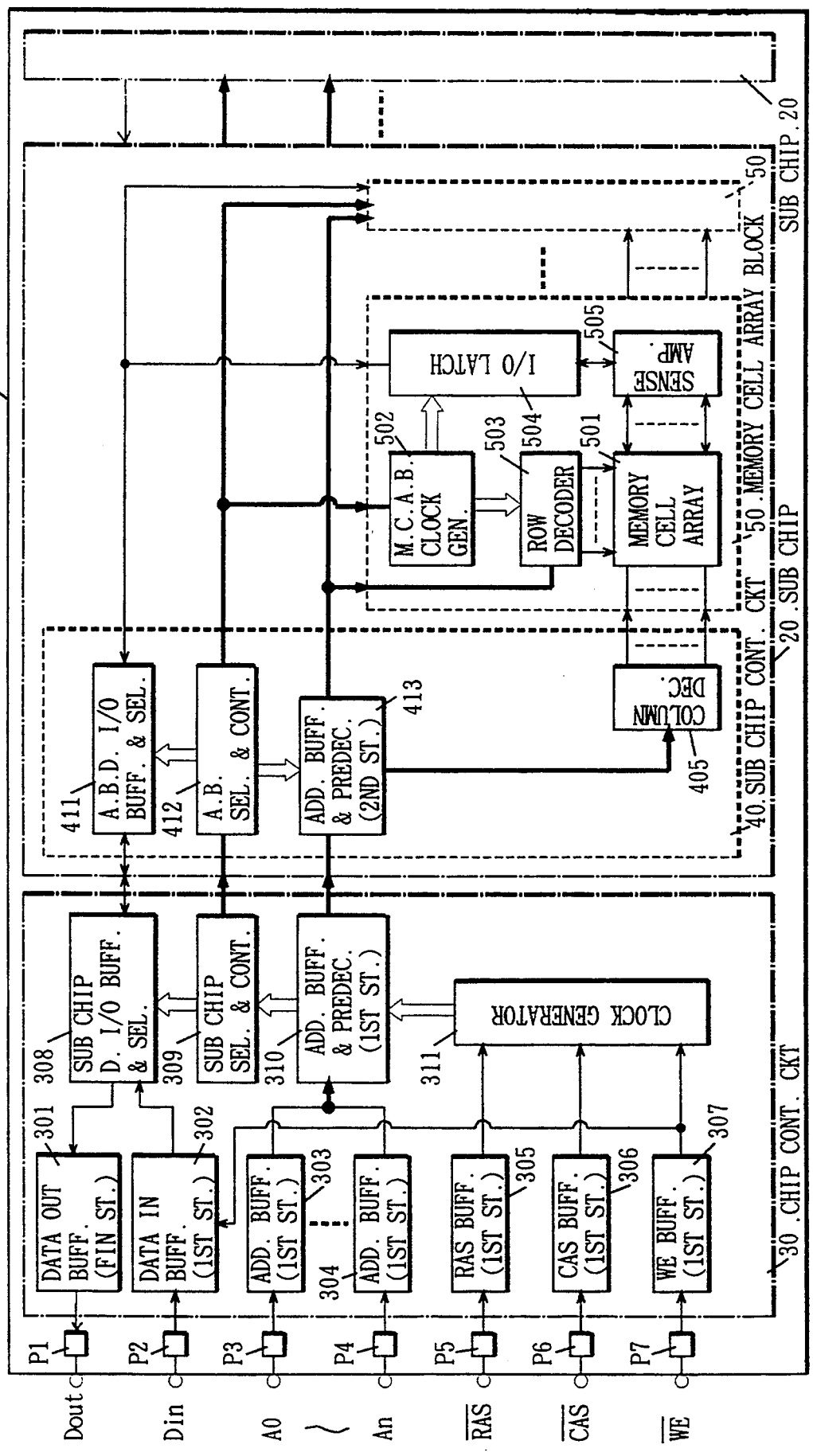
FIG. 4 is a functional block diagram showing another example of the detailed arrangement of the semiconductor memory shown in FIG. 1.

FIG. 4 is a functional block diagram showing another example of a detailed arrangement of the semiconductor memory shown in FIG. 10 The arrangement shown in FIG. 4 is different from that of FIG. 3 in that chip control circuit 30 further includes a sub chip data input/output buffer and selector 308, a sub chip select and control circuit 309, an address buffer and predecoder (in a first stage) 310 and a clock generator 311.

Clock generator 311 controls sub chip data input/output buffer and selector 308, sub chip select and control circuit 309 and address buffer and predecoder 310 in response to a row address strobe signal $\overline{RAS}$, a column address strobe signal $\overline{CAS}$ and a write enable signal $\overline{WE}$ respectively applied from row address strobe buffer 305, column address strobe buffer 306 and write enable buffer 307. Address buffer and predecoder 310 predecodes address signals A0-An applied from address buffers 303 and 304 and applies the predecoded signals to four sub chips 20. Address buffer and predecoder 310 also controls sub chip select and control circuit 309. Sub chip select and control circuit 309 selects one of the four sub chips 20 and activates the same. Sub chip data input/output buffer and selector 308 applies the data applied from the selected sub chip 20 to data out buffer 301 in a reading operation. Sub chip data input/output buffer and selector 308 applies the data applied from data in buffer 302 to the selected sub chip 20 in a writing operation.

Sub chip control circuit 40 includes an array block data input/output buffer and selector 411, an array block select and control circuit 412, an address buffer and predecoder (in a second stage) 413 and a column decoder 405.

Array block select and control circuit 412 controls array block data input/output buffer and selector 411 and address buffer and predecoder 413. Address buffer and predecoder 413 further predecodes the predecoded signals applied from address buffer and predecoder 310 and applies the signal to column decoder 405 and 16 memory cell array blocks 50. Array block select and control circuit 412 selects one of the 16 memory cell array blocks 50 and activates the same. Array block data input/output buffer and selector 411 applies the data read from the selected memory cell array block 50 to sub chip data input/output buffer and selector 308 in a reading operation. Array block data input/output buffer and selector 410 applies the data applied from sub chip data input/output buffer and selector 308 to the selected memory cell array block 50 in a writing operation.

The arrangement of each memory cell array block 50 is the same as that of memory cell array block 50 shown in FIG. 3.

An operation of the semiconductor memory will be described in the following with reference to FIG. 1. Data, an address signals and control signals input through a bonding pad in input/output buffer region 3 are amplified by an input buffer in a first stage of input-/output buffer region 3 and then transmitted to the sub chip control circuit 4 disposed at the center of the sub chip 2 selected by an address signal. In the sub chip control circuit region 4, the address signal selects one of the memory cell array blocks 5. A writing or reading operation is executed in the selected memory cell array block 5.

In a reading operation, the data read from the selected memory cell array block 5 is transmitted to the sub chip control circuit region 4 disposed at the center of the sub chip. The data is amplified by the sub chip control circuit region 4 and the amplified data is output to the outside of the chip through the data output buffer and the bonding pad in input/output buffer region 3.

Thus, the control signals and the address signals generated in sub chip control circuit region 4 disposed at the center of each sub chip 2 drive a plurality of memory cell array blocks 5 arranged at the opposite sides of chip control circuit region 4. In this case, an interconnection length between each sub chip control circuit region 4 and each memory cell array block 5 is approximately half the shorter side of the chip 1. Signal delay due to interconnections can be therefore considerably suppressed.

In addition, the number of signals output from the predecoder is limited to the number necessary in each sub chip 1. Therefore, the load of each circuit in sub chip control circuit region 2, as well as the number of required circuits, is reduced. As a result, the total area of a region for the control circuit is not made larger than that of a conventional semiconductor memory.

However, the number of signals generated in each sub chip control circuit region 4 is still several times the number of signals input or output from or to the outside of the chip. For this reason, a part of the signals for driving the memory cell array is arranged in memory cell array block 5. In addition, only a selected memory cell array operates.

As a result, the number of signals transmitted from each sub chip control circuit region 4 to each memory cell array block 5 and the load of the circuit for generating a signal for driving the memory cell array are both reduced. An operation speed is increased and power consumption is reduced as a result.

With a sub chip control circuit region 4 arranged for each sub chip 2, a signal interconnection between control circuits is shorter than that of a conventional semiconductor memory. A signal input or output through a bonding pad is applied to or from sub chip control circuit region 4 of each sub chip 2 through only a buffer in a first stage or a final stage. The number of signals is therefore not increased from that of a conventional semiconductor memory. Furthermore, only a control circuit in a sub chip 2 selected by an address signal is operated, resulting in a reduction of power consumption.

Figure 5:
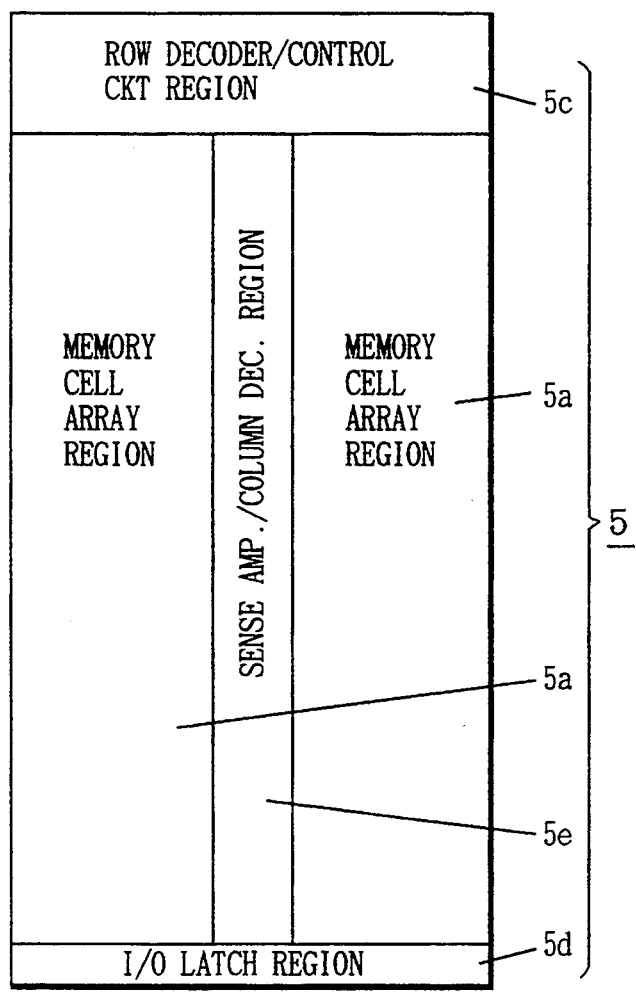
FIG. 5 is a diagram showing another example of an arrangement of a memory cell array block.

According to the examples shown in FIGS. 3 and 4, column decoder 405 is included in sub chip control circuit 40. Accordingly, sense amplifier region 5b shown in FIG. 2 includes sense amplifier 505 only. Column decoder 405 can be provided in each memory cell array block 50. In this case, column decoder 405 is included in sense amplifier and column decoder region 5e as shown in FIG. 5.

Figure 6:
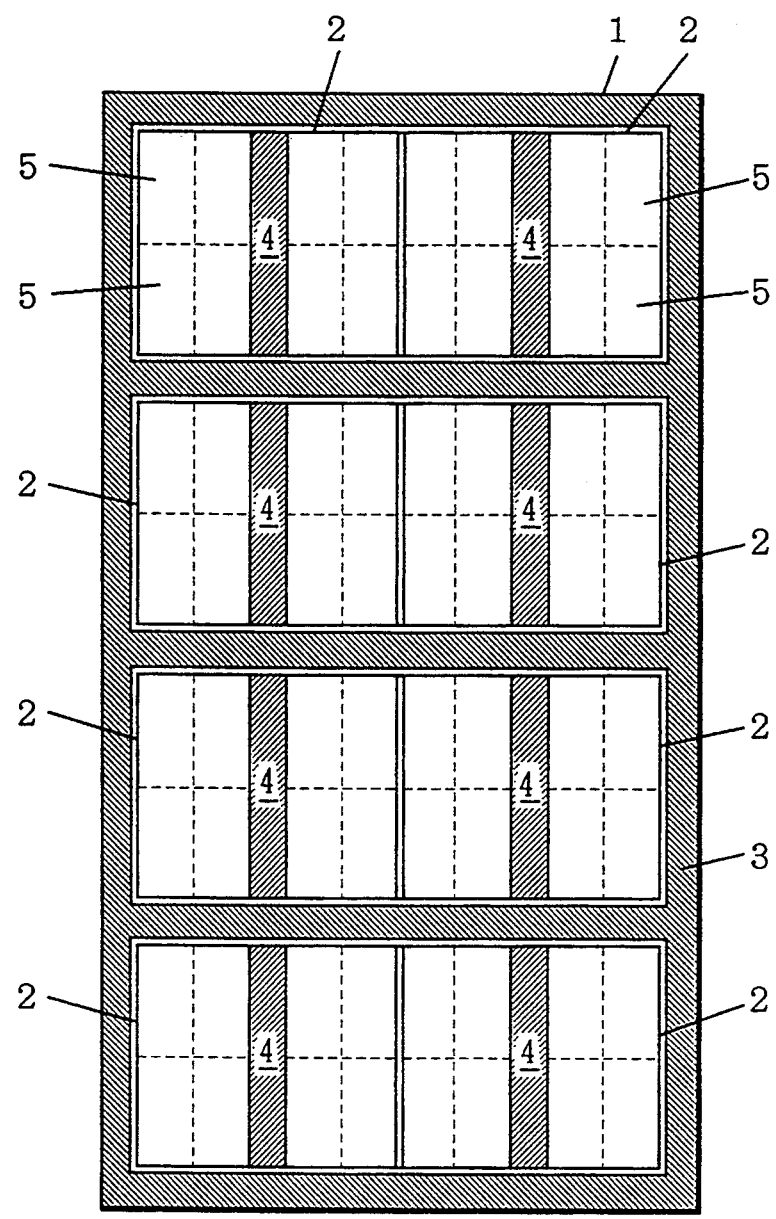
FIG. 6 is a diagram showing a layout on a semiconductor memory chip according to another embodiment of the present invention.
Figure 7:
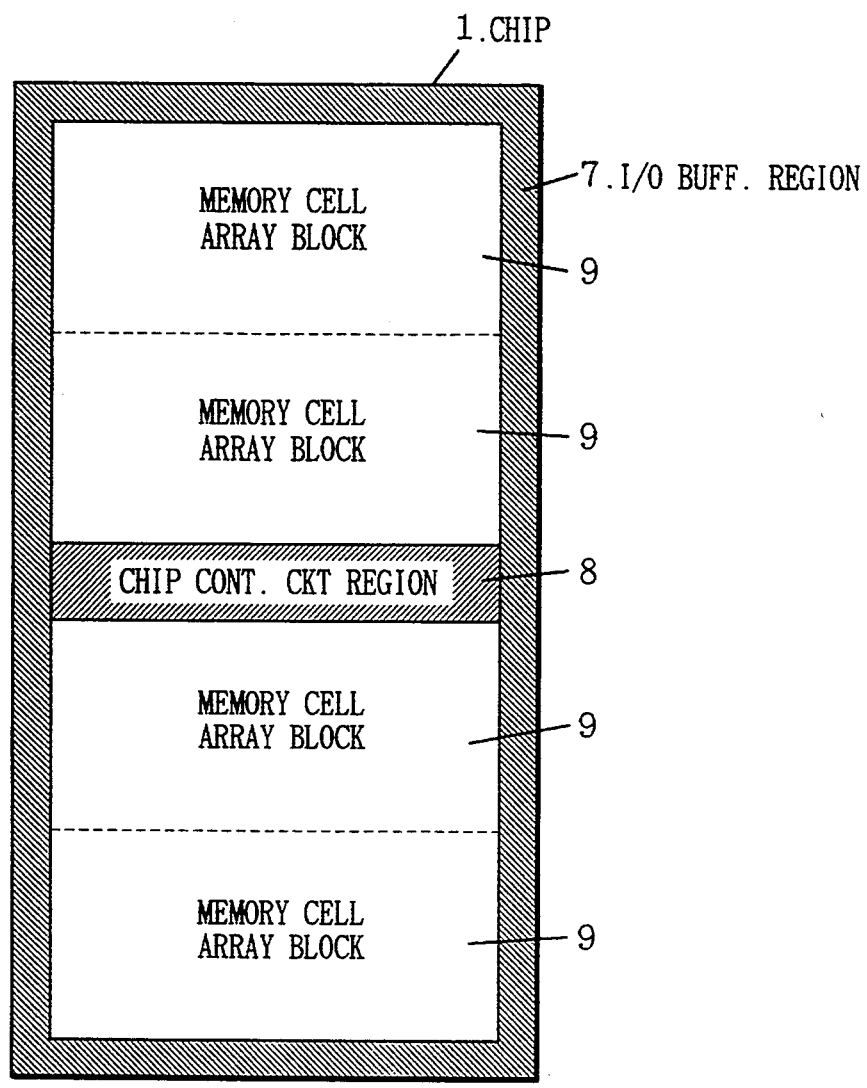
FIG. 7 is a diagram showing a layout on a conventional semiconductor memory chip.
Figure 8:
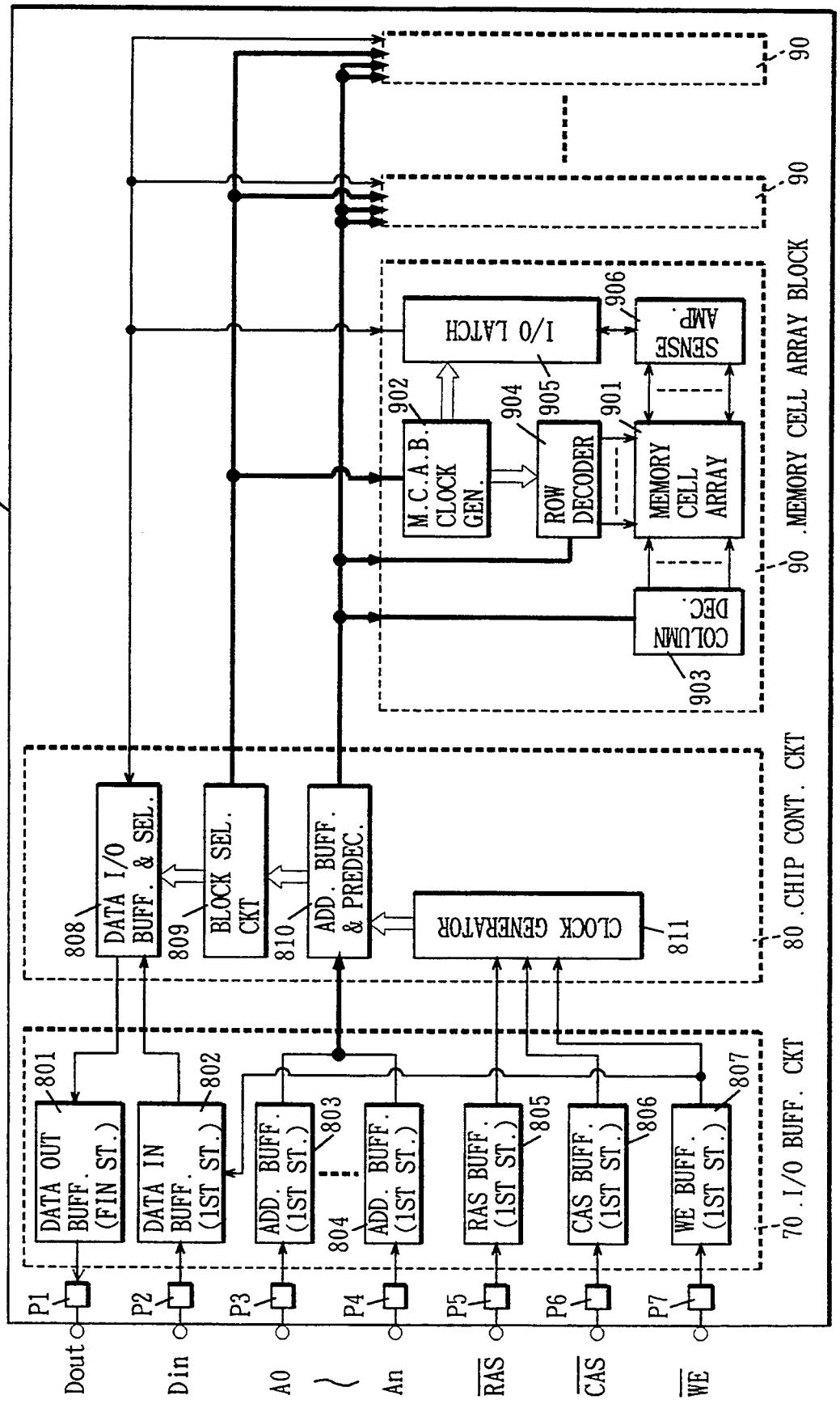
FIG. 8 is a functional block diagram showing the detailed arrangement of the semiconductor memory of FIG. 7.

FIG. 6 shows a layout on a semiconductor memory chip according to another embodiment of the present invention.

In FIG. 6, eight sub chips 2 are formed on a chip 1 and an input/output buffer region 3 is formed around sub chips 2.

Input/output buffer region 3 includes a bonding pad for inputting an externally applied signal or outputting a signal to the outside of the chip, a buffer in a first stage for input signals including an address signal, an output buffer in a final stage, some of peripheral circuits and signal interconnections therebetween.

Each sub chip 2 includes a sub chip control circuit region 4 and eight memory cell array blocks 5. Each sub chip control circuit region 4 is located at the center of sub chip 2. 8 memory cell array blocks 5 are respectively arranged at the opposite sides of sub chip control circuit region 4. Each sub chip control circuit region 4 includes a control circuit for controlling the sub chip 2 and such an address signal generation circuit corresponding to the sub chip 2 as a predecoder.

Each memory cell array block 5 includes a cell array having a storage capacity 1/64 of the total storage capacity of chip 1, a decoder, a sense amplifier, an input/output latch and some of control circuits for driving these elements.

Each sub chip 2 has an individual circuit arrangement. The operation of the semiconductor memory of FIG. 6 is the same as that of the semiconductor memory shown in FIG. 1.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device formed on a chip, comprising:
   a plurality of sub chips, and
   first controlling means for controlling an operation of said plurality of sub chips,
   each of said plurality of sub chips including:
      a plurality of cell array blocks, and
      second controlling means located at the center of said plurality of cell array blocks for controlling an operation of said plurality of cell array blocks,
   each of said plurality of cell array blocks including:
      a cell array, and
      third controlling means for controlling an operation of said cell array;
   wherein said first controlling means includes:
   a pad, and
   first buffer means for applying a signal of said pad to said plurality of sub chips or applying a signal applied from said plurality of sub chips to said pad;
   said second controlling means includes:
   second buffer means for applying a signal applied from said first controlling means to said plurality of cell array blocks or applying a signal applied from said plurality of cell array blocks to said first controlling means,
   selecting means responsive to the signal applied from said first controlling means for selecting one of said plurality of cell array blocks and activating the same, and
   first signal generating means responsive to the signal applied from said first controlling means for generating a control signal for controlling said second buffer means and said selecting means; and
   said third controlling means includes:
   inputting and outputting means for inputting a signal applied from a corresponding second controlling means to said cell array or applying a signal output from said cell array to the corresponding second controlling means, and
   second control signal generating means responsive to the signal applied from the corresponding second controlling means for controlling said inputting and outputting means.

2. The semiconductor integrated circuit device according to claim 1, wherein
   said pad includes:
      a first pad for inputting an externally applied data signal or outputting a data signal,
      a second pad for receiving an externally applied address signal, and
      a third pad for receiving an externally applied control signal, and
   said first buffer means includes:
      first data input/output buffer for applying the data signal of said first pad to said plurality of sub chips or applying the data signal applied from said plurality of sub chips to said first pad,
      a first address buffer for applying the address signal of said second pad to said plurality of sub chips, and
      a control signal buffer for applying the control signal of said third pad to said plurality of sub chips.

3. The semiconductor integrated circuit device according to claim 2, wherein
   said second buffer means includes:
      a second data input/output buffer for applying the data signal applied from said first data input/output buffer to said plurality of cell array blocks or applying the data signal applied from said plurality of cell array blocks to said first data input/output buffer, and a second address buffer for receiving the address signal applied from said first address buffer, said selecting means includes:

predecoder means for predecoding the address signal applied from said second address buffer, and block selecting means responsive to said address signal for selecting one of said plurality of cell array blocks and activating the same, and said first control signal generating means includes:

a first control signal generation circuit responsive to the control signal applied from said control signal buffer for generating a control signal for controlling said second buffer means and said selecting means.

4. The semiconductor integrated circuit device according to claim 3, wherein said inputting and outputting means includes:

decoder means for further decoding a predecoded signal applied from the corresponding predecoder means to designate an address of a memory cell of said cell array, and input/output circuit means for outputting a data signal read from said cell array to a corresponding second data input/output buffer or inputting a data signal applied from the corresponding second data input/output buffer to said cell array, and said second control signal generating means includes:

a second control signal generation circuit responsive to an output of said block selecting means for generating a control signal for controlling said decoder means and said input/output circuit means.

5. A semiconductor integrated circuit device formed on a chip, comprising:

a plurality of sub chips, and first controlling means for controlling an operation of said plurality of sub chips, each of said plurality of sub chips including:

a plurality of cell array blocks, and second controlling means located at the center of said plurality of cell array blocks for controlling an operation of said plurality of cell array blocks, each of said plurality of cell array blocks including:

a cell array, and third controlling means for controlling an operation of said cell array;

wherein said first controlling means includes:

a pad, first buffer means for applying a signal applied from said plurality of sub chips to said pad or applying a signal of said pad to said plurality of sub chips, first selecting means responsive to the signal applied from said first buffer means for selecting one of said plurality of sub chips and activating the same, and first control signal generating means responsive to the signal applied from said first buffer means for generating a control signal for controlling said first selecting means;

said second controlling means includes:

second buffer means for receiving a signal applied from said first controlling means or applying a signal applied from said plurality of cell array blocks to said first buffer means, and second selecting means responsive to the signal applied from said first controlling means for selecting one of said plurality of cell array blocks and activating the same; and said third controlling means includes:

inputting and outputting means for inputting a signal applied from a corresponding second controlling means to said cell array or applying a signal output from said cell array to the corresponding second controlling means, and second control signal generating means responsive to the signal applied from a corresponding second controlling means for generating a control signal for controlling said inputting and outputting means.

6. The semiconductor integrated circuit device according to claim 5, wherein said pad includes:

a first pad for inputting an externally applied data signal or outputting a data signal, a second pad for receiving an externally applied address signal, and a third pad for receiving an externally applied control signal, first buffer means includes:

a first data input/output buffer for applying the data signal of said first pad to said plurality of sub chips or applying a data signal applied from said plurality of sub chips to said first pad, a first address buffer for applying the address signal of said second pad to said plurality of sub chips, and a control signal buffer for receiving the control signal applied from said third pad, said first selecting means includes:

first predecoder means for predecoding the address signal applied from said first address buffer, and sub chip selecting means responsive to said address signal for selecting one of said plurality of sub chips and activating the same, and said first control signal generating means includes:

a first control signal generation circuit responsive to the control signal applied from said control signal buffer for generating a control signal for controlling said first selecting means.

7. The semiconductor integrated circuit device according to claim 6, wherein said second buffer means includes:

a second data input/output buffer for applying the data signal applied from said first data input/output buffer to said plurality of cell array blocks or applying the data signal applied from said plurality of cell array blocks to said first data input/output buffer, and a second address buffer for receiving the address signal applied from said first address buffer, and said second selecting means includes:

second predecoder means for further predecoding the predecoded signal applied from said first predecoder means, and block selecting means responsive to said address signal for selecting one of said plurality of cell array blocks and activating the same.

8. The semiconductor integrated circuit device according to claim 7, wherein said inputting and outputting means includes:

decoder means for decoding a predecoded signal applied from a corresponding second predecoder means to designate an address of a memory cell of said cell array, and input/output circuit means for outputting a data signal read from said cell array to a corresponding second data input/output buffer or inputting a data signal applied from said the corresponding second data input/output buffer to said cell array, and said second control signal generating means includes:

a second control signal generation circuit responsive to the output of said block selecting means for generating a control signal for controlling said decoder means and said input/output circuit means.

* * * * *